(12) United States Patent
Del Puerto

(10) Patent No.: US 8,553,207 B2
(45) Date of Patent: Oct. 8, 2013

(54) OPTICALLY COMPENSATED UNIDIRECTIONAL RETICLE BENDER

(75) Inventor: Santiago E. Del Puerto, Milton, NY (US)

(73) Assignee: ASML Holdings N.V., Veldhoven (NL)

( * ) Notice: Subject to any disclaimer, the term of this patent is extended or adjusted under 35 U.S.C. 154(b) by 277 days.

(21) Appl. No.: 12/419,688

(22) Filed: Apr. 7, 2009

(65) Prior Publication Data
US 2010/0167189 A1    Jul. 1, 2010

Related U.S. Application Data

(60) Provisional application No. 61/141,951, filed on Dec. 31, 2008.

(51) Int. Cl.
*G03B 27/62* (2006.01)

(52) U.S. Cl.
USPC .......................................................... 355/75

(58) Field of Classification Search
USPC ............................................... 355/55, 60, 75
See application file for complete search history.

(56) References Cited

U.S. PATENT DOCUMENTS

| | | | |
|---|---|---|---|
| 5,557,469 A * | 9/1996 | Markle et al. ................. | 359/683 |
| 5,777,722 A | 7/1998 | Miyazaki et al. | |
| 6,879,374 B2 | 4/2005 | Van Der Werf et al. | |
| 7,221,434 B2 | 5/2007 | Shiode et al. | |
| 2003/0003383 A1 * | 1/2003 | Van Der Werf et al. ........ | 430/30 |
| 2003/0081193 A1 * | 5/2003 | White et al. ..................... | 355/72 |
| 2004/0046950 A1 * | 3/2004 | Sasaya et al. ................... | 355/55 |
| 2005/0270516 A1 * | 12/2005 | Cherala et al. ................. | 355/72 |
| 2006/0268255 A1 * | 11/2006 | Shiode et al. ................... | 355/75 |
| 2007/0024831 A1 * | 2/2007 | Hibbs et al. .................... | 355/75 |

FOREIGN PATENT DOCUMENTS

| | | |
|---|---|---|
| JP | 07-086139 A | 3/1995 |
| JP | 07-307284 A | 11/1995 |
| JP | 09-167736 A | 6/1997 |
| JP | 11-054398 A | 2/1999 |
| JP | 2000-068189 A | 3/2000 |
| JP | 2006-279029 A | 10/2006 |
| TW | I266959 B | 11/2006 |

OTHER PUBLICATIONS

English translation for JP 07-086139 A published on Mar. 31, 1995.*
English translation for JP 11-054398 A published on Feb. 26, 1999.*

(Continued)

*Primary Examiner* — Glen Kao
(74) *Attorney, Agent, or Firm* — Sterne, Kessler, Goldstein & Fox P.L.L.C

(57) ABSTRACT

Patterning provided by a lithographic apparatus is optically corrected for focus errors that would result from a topology of a substrate being patterned. Focus control is provided in a cross-scan direction by bending a reticle about a scan axis based on a mapped topology of the substrate. The bending can be updated from field to field as the reticle is scanned. The bending may be unidirectional (e.g., down only), but an optical compensation element (e.g., a lens or mirror polished to a cylindrical shape or a transparent plate or mirror bent by a force actuator to a cylindrical shape) can be included in order to introduce either positive or negative curvature (or no curvature) to the beam wavefront, thereby simplifying the mechatronics of the bender.

24 Claims, 15 Drawing Sheets

(56) References Cited

OTHER PUBLICATIONS

English-Language Translation of Notice of Reasons for Rejection directed to related Japanese Patent Application No. 2009-284614, mailed Dec. 6, 2011, from the Japanese Patent Office; 3 pages.

English-Language Abstract for Japanese Patent Publication No. 07-086139 A, published Mar. 31, 1995; 1 page.

* cited by examiner

OPTICALLY COMPENSATED UNIDIRECTIONAL RETICLE BENDER

CROSS REFERENCE TO RELATED APPLICATIONS

This application claims priority to U.S. Provisional Application No. 61/141,951, filed Dec. 31, 2008, the disclosure of which is incorporated in its entirety herein by reference thereto.

BACKGROUND OF THE INVENTION

1. Field of the Invention

The present invention relates generally to lithography, and more particularly to lithography focus control apparatus and methods.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction, also referred to as the "y-direction") while synchronously scanning the substrate parallel or anti-parallel to this direction. It is also possible to transfer the pattern from the patterning device to the substrate by imprinting the pattern onto the substrate.

In manufacturing a device by lithography, focus control of the radiation beam onto the substrate is of paramount importance. One key source of error in focus control is the inherent unevenness of the substrate, for example the wafer. If the local topology of the substrate is mapped and known, this unevenness can be partially compensated for in the scanning direction by adjusting the patterning device in the vertical direction ("z-direction") according to the mapped topology of the substrate. However, this does nothing to correct for focus errors in the non-scanning ("x-direction"). The patterning device can also be rotated about axes parallel and perpendicular to the scanning direction, but this only partially corrects for focus errors in the x and y directions. Because of these reasons, focus control in the x-direction is a major challenge. In other cases, even the inherent unevenness of the patterning device itself can introduce errors into focus control.

BRIEF SUMMARY OF THE INVENTION

Embodiments of the present invention relate to a patterning device handler of a lithographic apparatus. One embodiment of the present invention provides the lithographic apparatus that includes a support structure supporting a patterning device having a pattern thereon. The patterning device constructed and arranged to impart at least a portion of the pattern to an incident radiation beam. The support structure includes a bender constructed and arranged to bend the patterning device. The lithographic apparatus includes a projection system disposed between the patterning device and a substrate position, capable of projecting the radiation beam from the patterning device onto a substrate located at the substrate position.

One embodiment of the present invention provides a method of manufacturing including mapping a topology of a substrate, bending a patterning device in a manner related to the mapped topology of the substrate. The method includes directing a radiation beam onto the patterning device; imparting a portion of the pattern to the radiation beam; and projecting the radiation beam from the patterning device onto the substrate.

One embodiment of the present invention provides a computer readable media containing program instruction, which when executed by a processor-based control system, causes the system to control a lithographic apparatus in accordance with a method. The method comprises: mapping a topology of a substrate, bending a patterning device of the lithographic apparatus with a bender of the lithographic apparatus in a manner related to the mapped topology of the substrate, directing a radiation beam onto the patterning device, and projecting the radiation beam from the patterning device onto the substrate with a projection system of the lithographic apparatus.

One embodiment of the present invention provides a support structure for holding a given bendable patterning device having a pattern thereon in a lithographic apparatus. The support structure comprises a bender configured to bend the patterning device in a first direction based on a mapped topology of a substrate for correcting a focus error resulting from a topology of the substrate being patterned when the patterning device imparts at least a portion of the pattern to an incident radiation beam. The support structure is configured to optically compensate the bending of the patterning device in a second direction being opposite to the first direction.

BRIEF DESCRIPTION OF THE DRAWINGS/FIGURES

The above summary sets forth many, but not all aspects of the invention. Other aspects of the invention should be apparent to those skilled in the art to which the invention pertains by reading the descriptions of various "embodiments" of the invention in conjunction with reference to the drawings. In setting forth the following embodiments, the present invention is illustrated by way of example, and not by way of limitation. In the figures, like reference numerals refer to similar elements.

FIGS. 1A and 1B respectively depict reflective and transmissive lithographic apparatuses consistent with one embodiment of the present invention;

DETAILED DESCRIPTION OF THE INVENTION

Figure 1A:
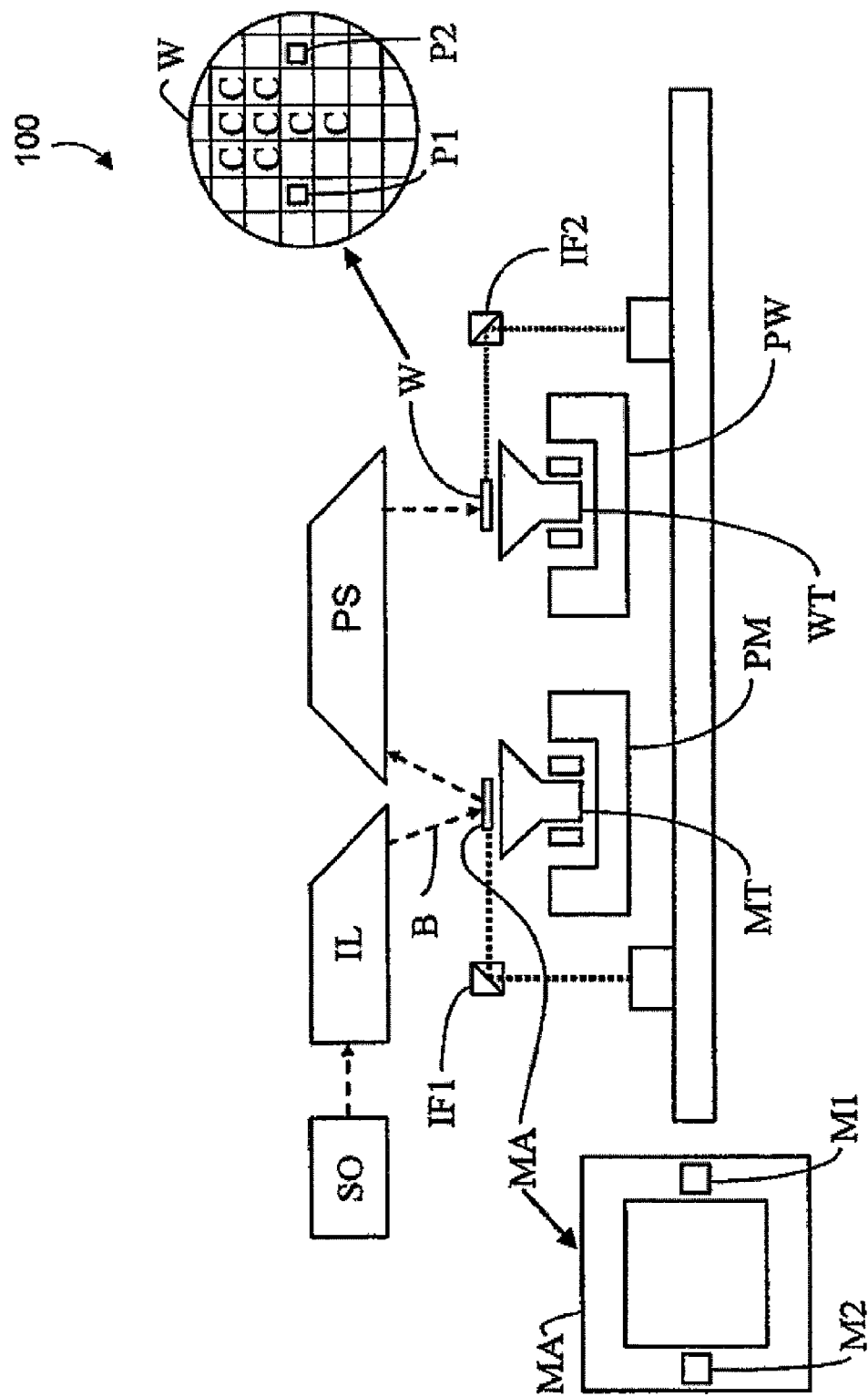

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Likewise, the drawings showing embodiments of the system are semi-diagrammatic and schematic and are not drawn to scale. Some of the dimensions are exaggerated for the clarity of presentation.

Similarly, although the views in the drawings for ease of description generally show similar orientations, this depiction in the figures is arbitrary for the most part. Apparatus illustrated can be operated in orientations other than as illustrated. In addition, where multiple embodiments are disclosed and described having some features in common, for clarity and ease of illustration, description, and comprehension thereof, similar and like features one to another will ordinarily be described with like reference numerals.

Figure 1B:
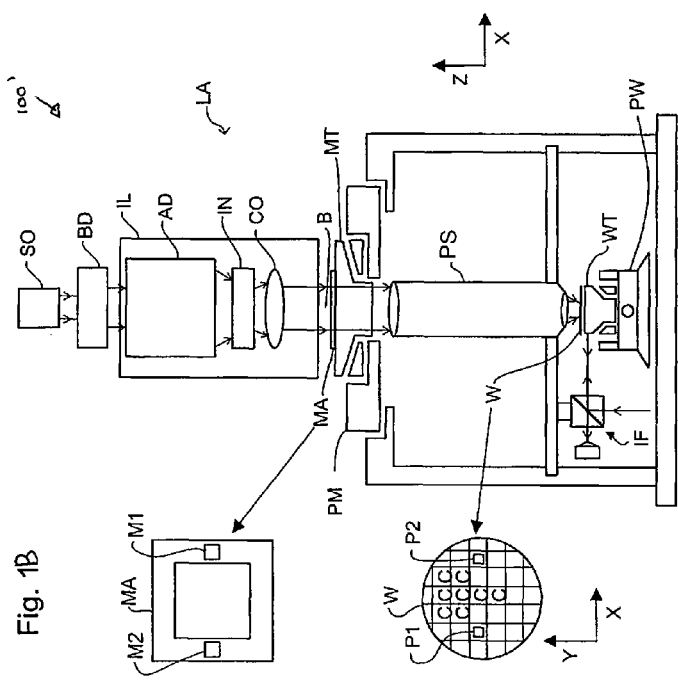

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as □-outer and □-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g., so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Combinations and/or variations on the above described modes of use or entirely different modes of use may also be employed.

Figure 2:
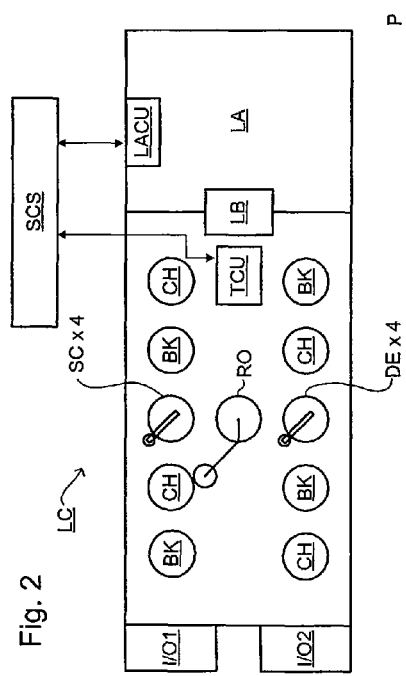
FIG. 2 is schematic of a lithographic cell consistent with one embodiment of the present invention.

As shown in FIG. 2, the lithographic apparatus LA forms part of a lithographic cell LC, sometimes referred to a lithocell or cluster, which also includes apparatus to perform pre- and post-exposure processes on a substrate. In one example, a lithocell or cluster may include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU, which is itself controlled by the supervisory control system SCS, which also controls the lithographic apparatus via lithography control unit LACU. Thus, the different apparatus can be operated to maximize throughput and processing efficiency.

Figure 3:
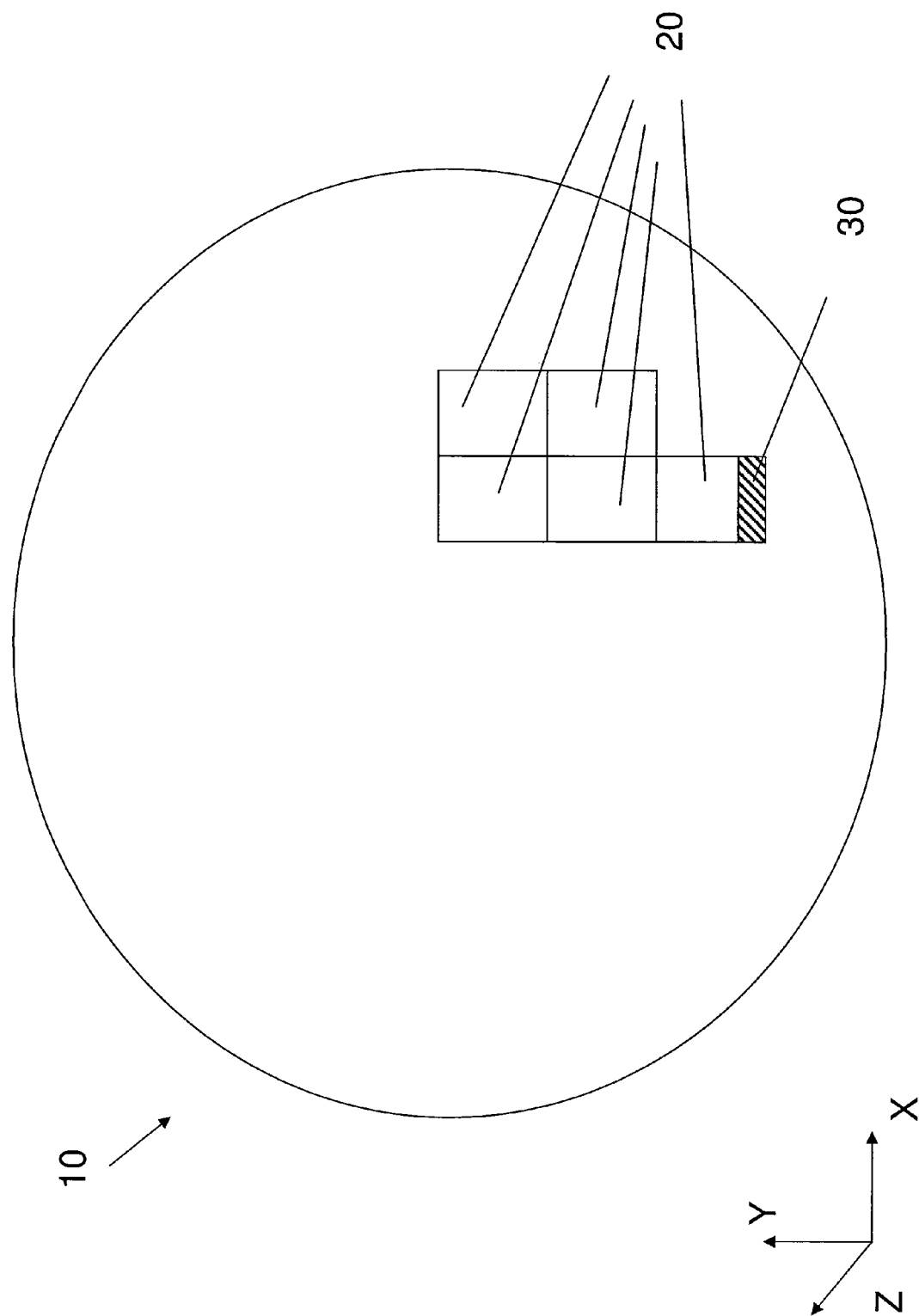
FIG. 3 is a schematic of a wafer consistent with one embodiment of the present invention.

FIG. 3 shows a schematic of a wafer 10, which typically has a 300 mm diameter. In one embodiment, wafer 10 is subdivided into fields 20, only some of which are shown for clarity. In one embodiment, fields 20 are 26 by 32 mm at the wafer. A lithographic apparatus may have a reduction factor of four, meaning that the corresponding field on the patterning device is four times larger than fields 20 on the wafer. In other embodiments, a lithographic apparatus can have a different reduction factor, no reduction factor, or the fields on the patterning device can be smaller than corresponding fields on the wafer. In one embodiment, an exposure slit 30 is scanned in the y-direction in each field.

Since wafers are inherently uneven, focus errors are induced as the beam is scanned in the y-direction. In order to account for the inherent unevenness of the wafer 10, a lithographic apparatus may include a sensor to map the topology of the wafer. Such sensors are known in the art, and are capable of mapping topology down to the nanometer scale. The reticle can be displaced vertically (in the z-direction) in response to the locally mapped topology of the wafer. "Locally" can mean either directly at the current location of the exposure slit 30, an average value for each field 20 that the exposure slit is occupying, or some other average topology in a given region. This vertical displacement works fairly well to correct focus errors in the y-direction, but does not correct for focus errors in the cross-scan, or x-direction. To this end, the reticle can be tilted (about the x, y, or even z-axis). This tilt helps to compensate for some focus error, but it is only a "first order" correction.

Higher order corrections can come from the projection system (e.g., a compensating or adjustable lens can distort the wavefront of the beam to offset the local topology of the wafer), the reticle itself (the reticle can be bent up or down according to the local topology of the wafer 10), or combinations of a compensating projecting system and a bendable reticle. In theory, several combinations of compensating projection systems and bendable reticle systems can correct for focus errors in the x-direction, but in practice financial and engineering concerns impose a limit on what is actually feasible for use in manufacturing. These concerns and solutions addressing them will be discussed in more detail.

Figure 4:
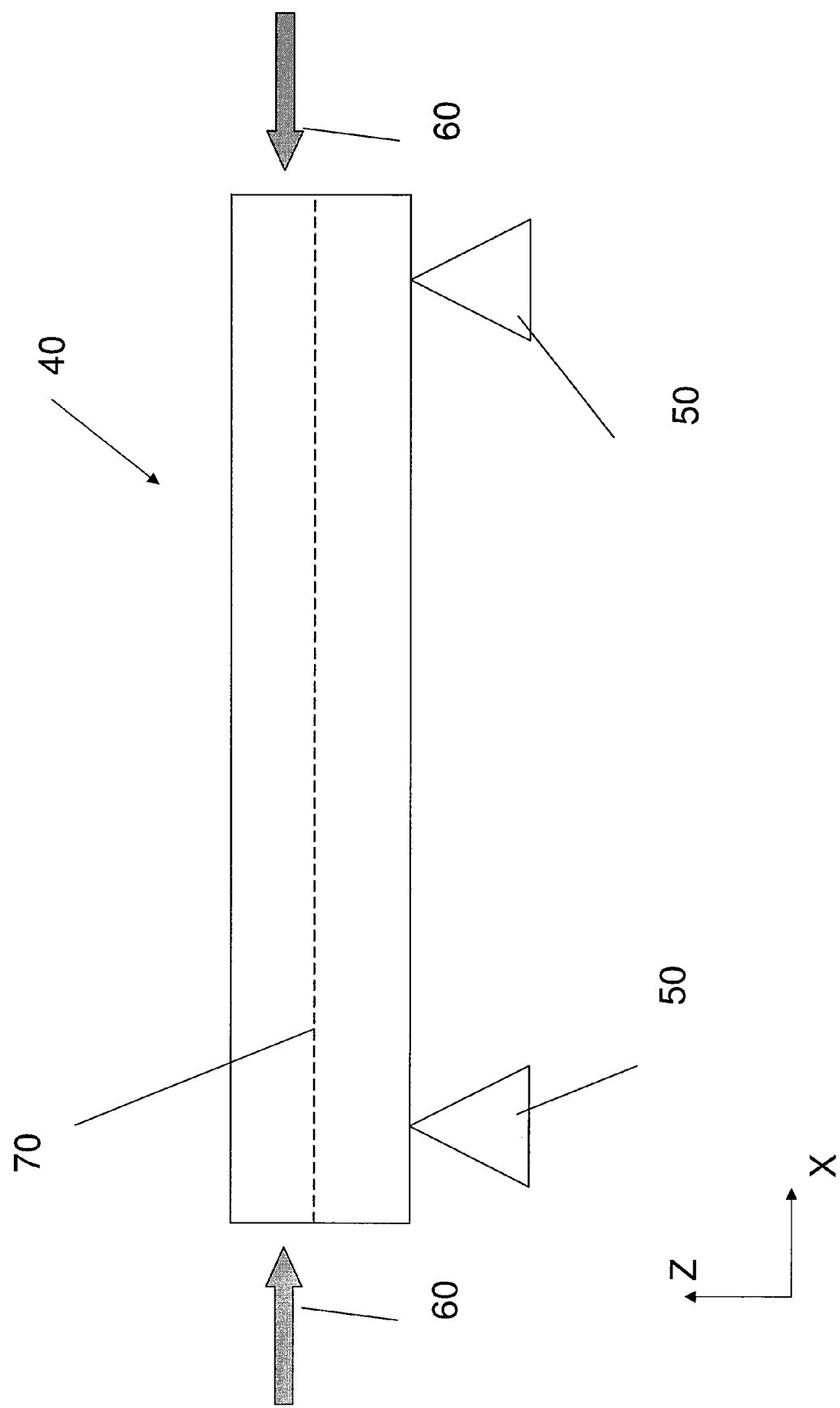
FIG. 4 is a side view of a patterning device consistent with one embodiment of the present invention.

One way to bend a patterning device is to apply equal and opposite forces at the patterning device edges in order to produce a bending moment. FIG. 4 shows a generic patterning device 40 being supported by supports 50 of a known patterning device handler (not shown for simplicity). Supports 50 may correspond to a portion of supports structures MT as shown in FIG. 1A and FIG. 1B. A pair of equal and opposite forces (represented by arrows) 60 are shown at a point in time just before being applied parallel to a neutral axis 70 of patterning device 40. Forces 60 may be supplied by a bender (not shown). In one embodiment, forces 60 can be applied half-way between a top (or bottom) edge of patterning device 40 and neutral axis 70.

Figure 5:
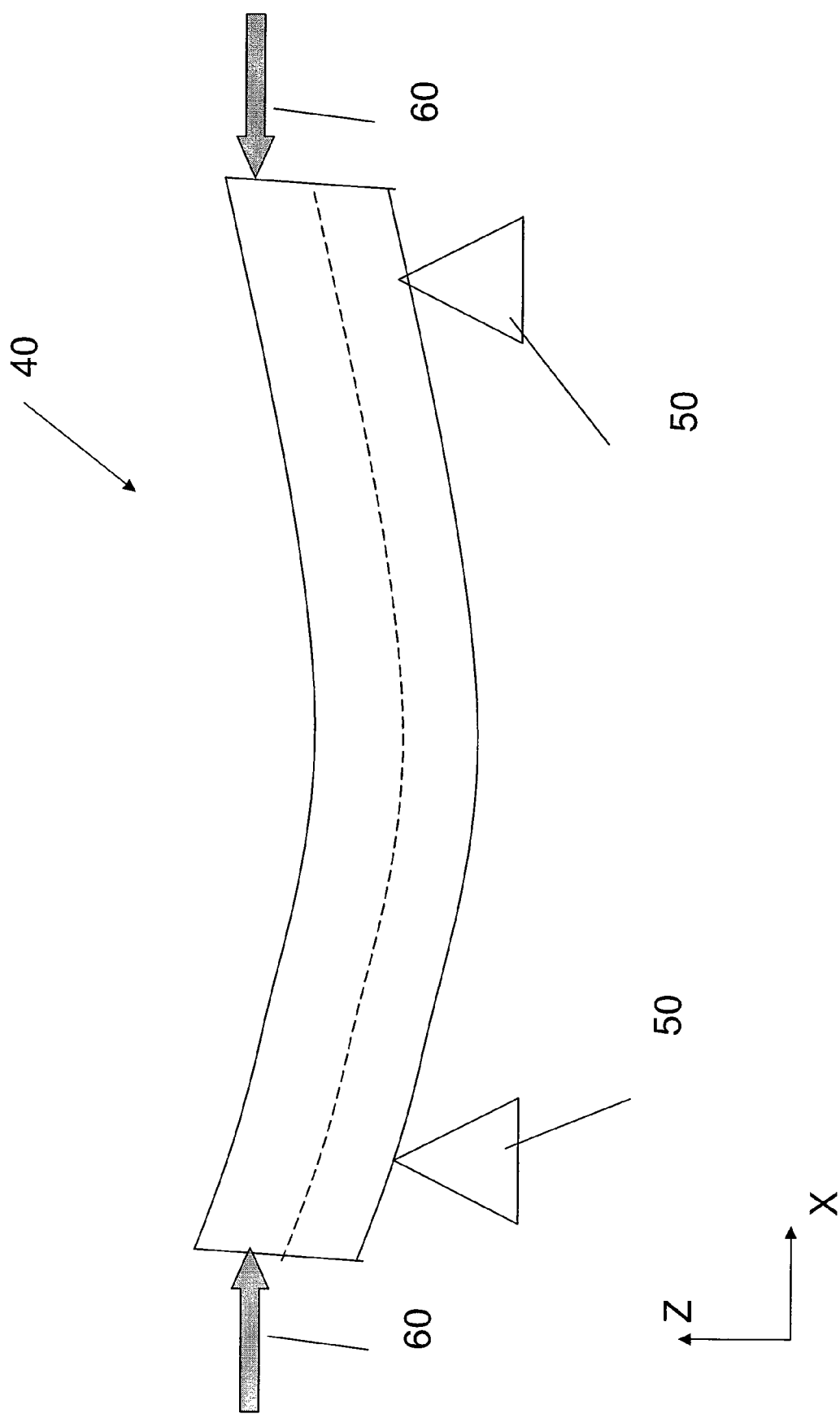
FIG. 5 is a side view of the patterning device of FIG. 3 in a bent configuration consistent with one embodiment of the present invention.

If compressive forces 60 are applied above neutral axis 70 (as shown in FIG. 4), a bending moment will be produced causing a positive (center downward) curvature in patterning device 40, as shown in FIG. 5. The curvature shown is greatly exaggerated for clarity. If the forces are applied below neutral axis 70, a negative curvature (center upward) can be generated (not shown).

In another embodiment, tensile forces (as opposed to compressive forces) can be applied. If tensile forces are applied above neutral axis 70, a bending moment will be produced causing a negative curvature—the reverse from what is shown in FIG. 5. If tensile forces are applied below neutral axis 70, a positive curvature results (not shown).

In FIG. 4 and FIG. 5, bending occurs about an axis substantially parallel to the y-axis (scan direction). In this way, patterning device 40 is bent along the x-axis (cross-scan direction). This allows for a higher order correction than merely tilting the patterning device in response to a locally uneven wafer surface underneath patterning device 40.

As mentioned, a bender could apply either compressive or tensile forces to patterning device 40 in order to induce curvature. Compressive forces are relatively easy to apply. On the other hand, tensile forces (pulling the patterning device) are more difficult to apply. Since patterning devices in typical lithographic apparatuses are normally only temporarily attached, a thin clamp (for example a vacuum clamp or an electrostatic clamp) or a sticky surface could be used to apply tensile forces according to one exemplary embodiment of the present invention. Given the size of the patterning device and the magnitude of forces necessary to bend it, compressive forces may be more effective and far cheaper to implement in practice according to one exemplary embodiment of the present invention.

Figure 6:
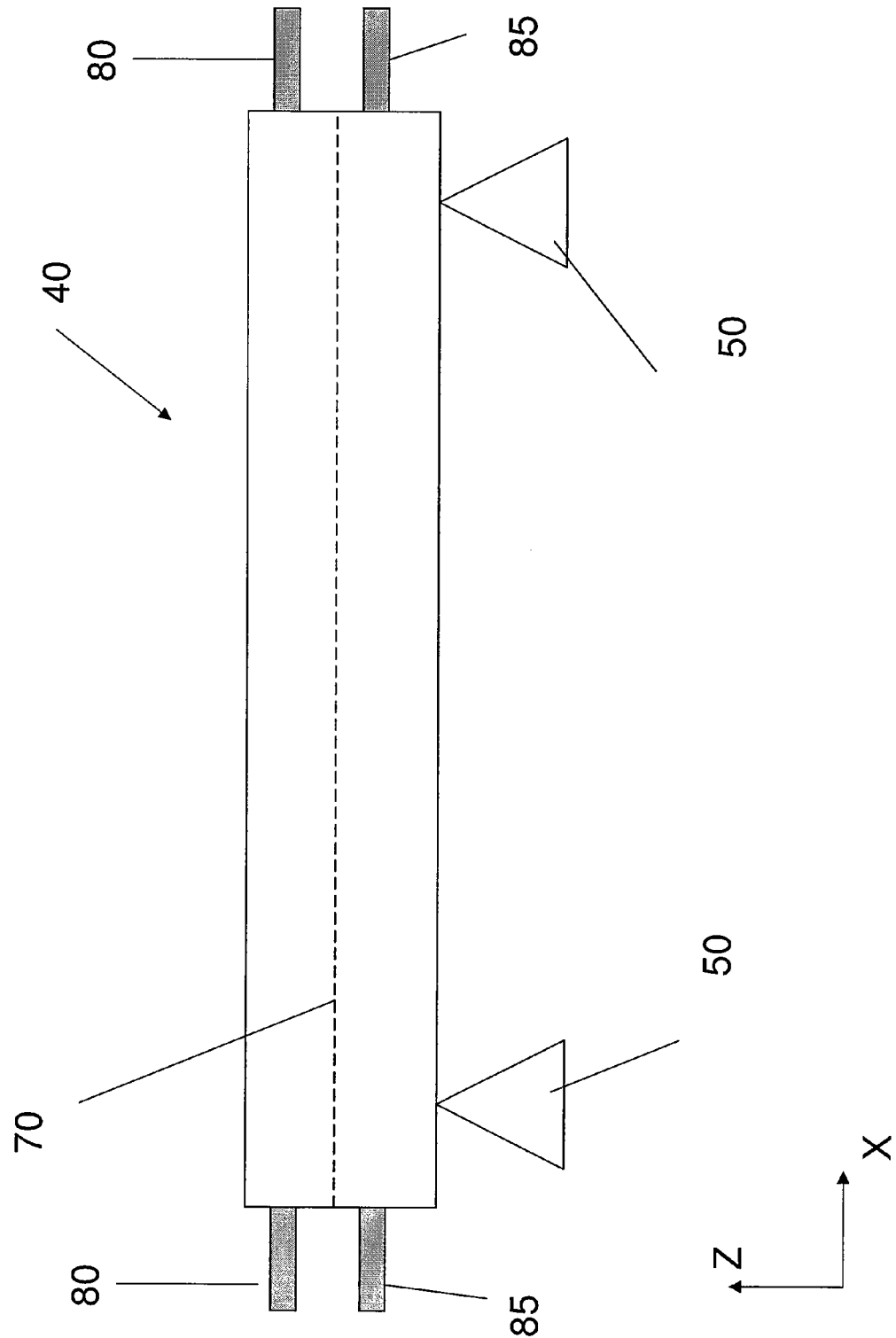
FIG. 6 is side view of a patterning device having an array of linear actuators consistent with one embodiment of the present invention.

Since compressive forces are easier to apply, having to produce both positive and negative curvature (in order to account for unevenness in the wafer) makes the problem more difficult. If unidirectional (for example, push only type linear actuators) linear actuators are used, one row of actuators 80 can be situated above the neutral axis 70, and one row of actuators 85 can be situated below the neutral axis 70, as shown in FIG. 6. If more complex bidirectional linear actuators (for example push/pull type actuators) are used, a single row of push/pull actuators could accomplish bidirectional bending, but each actuator would have to actuate a lever to convert, for example, a pulling action above the neutral plane into a pushing action below the neutral plane (not shown). Each complication to the bender may make that design less desirable because the bender is desired to be a compact, lightweight device in order to avoid compromising the dynamics of the support structure. Consistent with one embodiment of the present invention, ideally the bender is desired to have a fast response time in order to change the curvature of the patterning device periodically, for example, from one exposed field to the next.

Figure 7:
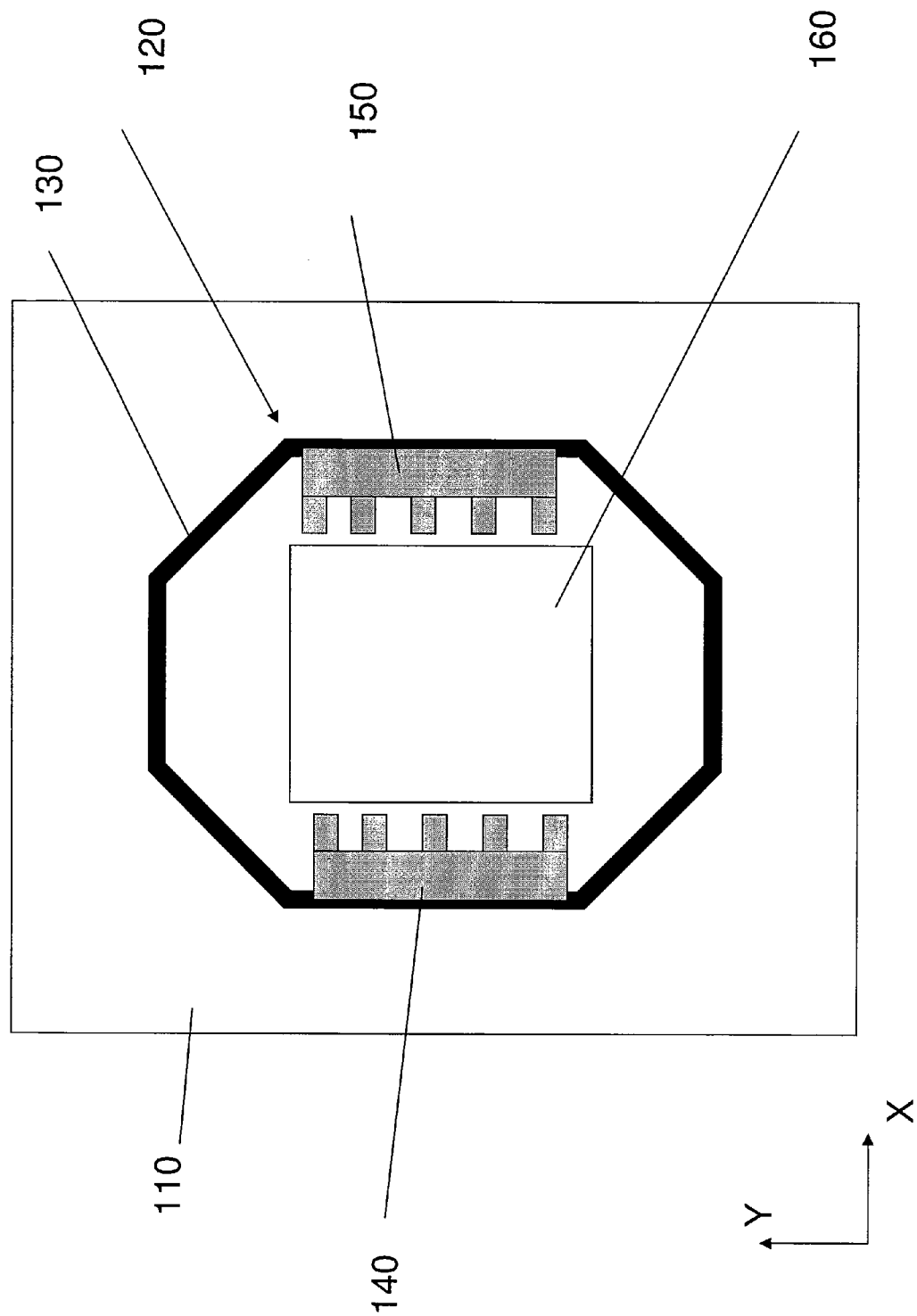
FIG. 7 is top planview of a support structure having a reaction frame and actuators consistent with one embodiment of the present invention.

Ideally, the bender is expected to apply only pure forces to the patterning device in accordance with one embodiment of the present invention. In one embodiment, the term "pure forces" refers to a situation in which the bender does not add appreciable stiffness to the patterning device or support structure supporting it. One way of accomplishing this is to couple array actuators 140 and 150 to a reaction frame 130 of bender 120 as shown in plan view in FIG. 7. In the illustrated embodiment of the present invention, reaction frame 130 is shown to only kinematically couple to support structure 110. In operation, equal and opposite forces from actuators 140 and 150 on opposite edge faces of patterning device 160 substantially cancel each other out inside reaction frame 130.

A mechanically stiff actuator, for example a piezoelectric transducer may transfer distortions of the reaction frame 130 to the patterning device 160, and therefore be undesirable. Examples of pure force actuators are Lorentz and reluctance actuators. The simplest and most compact reluctance actuator, the electromagnet, would provide the required force with minimum power dissipation in one embodiment of the present invention. This actuator, however, is unidirectional, so their two rows may be disposed along each face of the patterning device 160 in order to provide both positive and negative curvature.

In order to avoid the extra cost and complexities of having two rows of actuators on each face of the patterning device 160, in one embodiment of the present invention a unidirectional bender (i.e., capable of only positive or negative curvature) can be combined with an optical compensating element to accomplish the same focus control that the more complicated bender may achieve. What makes this possible is to transform unidirectional bending of the patterning device 160 into bi-directional bending of the wavefront of the beam which is then projected onto the wafer 10. This is shown schematically in FIG. 8 according to one embodiment of the present invention. On the left side of FIG. 8, three actual patterning device shapes are shown. The reference numeral 210 represents a flat patterning device, 240 shows a mildly bent patterning device, and 270 shows the patterning device bent to its maximum deflection. Notice that the patterning device is bent in only one direction, in this case down. On the right hand side of FIG. 8, projections of the bent wavefront as seen at the wafer are shown at 230, 260, and 290.

Figure 8:
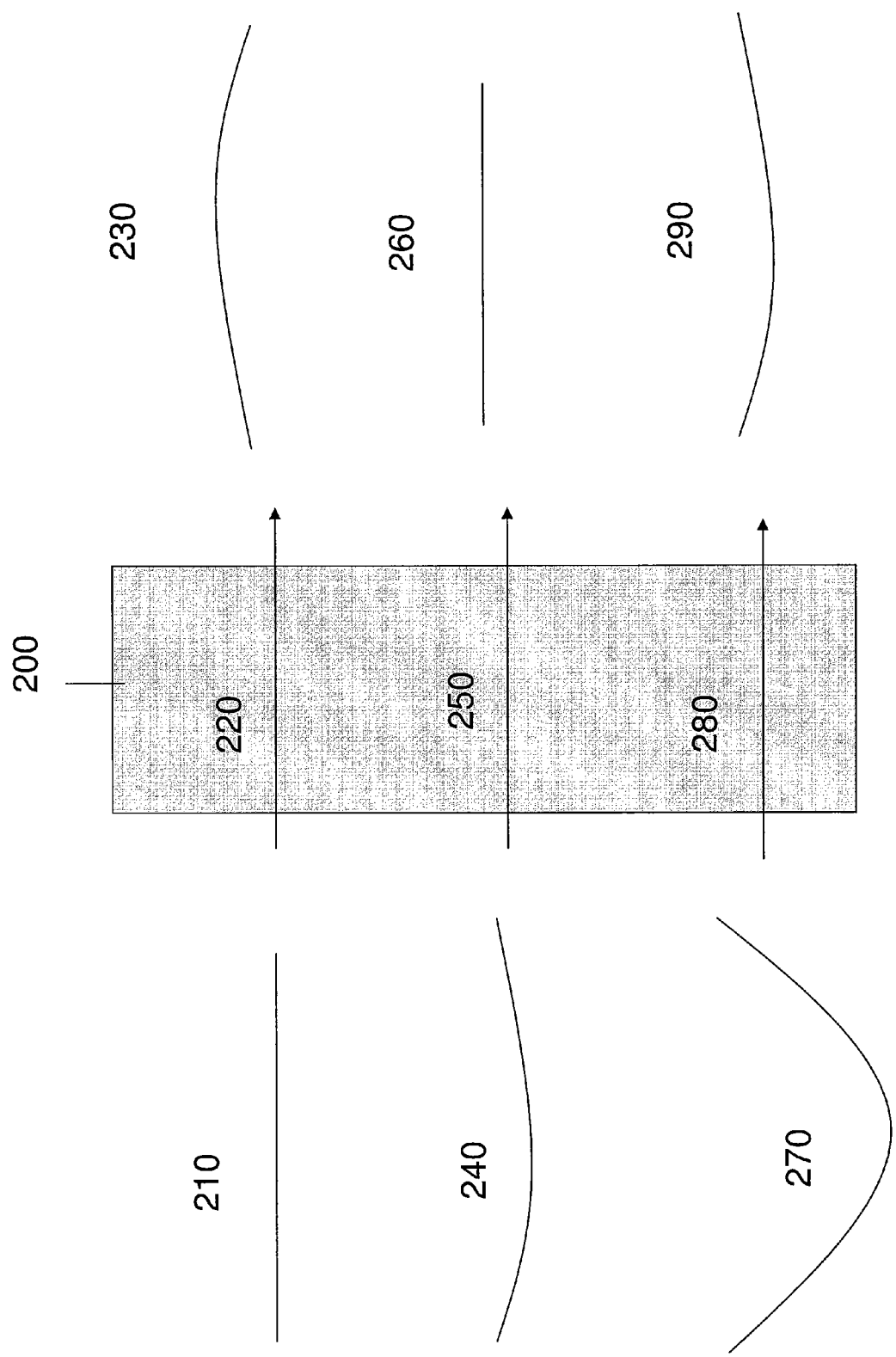
FIG. 8 is a schematic illustrating an optical compensating element consistent with one embodiment of the present invention.

In FIG. 8, optical compensating element 200 is a "fixed" optical compensating element. A "fixed" element applies a constant compensation bending (magnitude and direction) to an incident beam. In the example shown, the bender produces positive curvature (on the left hand side of FIG. 8), while optical compensating element 200 produces negative curvature of a fixed magnitude. A wavefront 220 leaving an unbent patterning device 210 passes through optical compensating element 200 and is bent to shape 230 at the wafer. Notice that shape 230 has an opposite curvature (e.g., negative curvature) from any curvature that the bender is capable of producing. In this way, bi-directional bending of the wavefront may be achieved in one embodiment of the present invention.

If the bender produces a mildly curved patterning device 240 of equal (but opposite) magnitude to the fixed correction produced by optical compensating element 200, wavefront 250 will be bent such that its projection 260 on the wafer will be flat. This would correspond to situations where the exposure slit is over a locally flat wafer. When the bender is at its maximum deflection 270, wavefront 280 passing through the compensation element will be bent such that the wafer 10 sees a mildly bent wavefront 290.

As can be appreciated from FIG. 8, a bender may be configured for unidirectional bending in a first direction. In the illustrated embodiment, the direction is down (See 240 and 270). The optical compensating element 200 is configured to bend the wavefront of the beam in a direction different from and related to the first direction. In the illustrated embodiment, the direction is opposite to the first direction (See 260 and 290).

In one embodiment, the optical compensating element 200 can be incorporated with the projection system, for example projection systems PS as shown in FIG. 1A and FIG. 1B. In one embodiment, a fixed optical compensation element comprises a lens polished to a substantially cylindrical shape. In another embodiment, a fixed optical compensation element may comprise a mirror polished to a substantially cylindrical shape. Fixed compensation will include bending at times when the wafer 10 is flat, where normally no bending would be desirable. To account for this, a mild bend at the patterning device 240 is used to transform it to a substantially flat wavefront 260 at the wafer by optical compensating element 200.

In another embodiment consistent with the present invention, the optical compensating element 200 may be adjustable as opposed to being fixed. In this case, the bender may be unnecessary because an adjustable optical compensating element can produce both positive and negative curvatures of varying magnitude.

However, incorporating an adjustable compensating element raises a number of challenges that must be addressed. First, it is important that the response time of the bender is not substantially shorter than the response time of an adjustable optical system. By way of example, the response time of the system as shown in FIG. 8 can be on the order of less than 50 ms. This means that if an adjustable compensating element (e.g., adjustable transparent flat plates or flat mirrors) is used without a bender, and the response time of the element is much greater than 50 ms, the lithographic process will come to a halt as the exposure slit moves to a new area of the wafer with a different curvature until the adjustable system can respond. Second, an adjustable optical compensating element may also be much more expensive than a fixed optical compensating element, especially if it is designed to adjust very quickly or in very fine steps. On the other hand, a slow adjustable optical compensating element or one that operates only between two fixed states (e.g., constant bend or substantially flat) may be preferable to a permanently fixed one because it would allow the user of the lithographic apparatus the choice of not using reticle bending at all for a particular process recipe or using bending for other process recipes.

There are several adjustable optical compensating element designs that meet the challenges described above. In one embodiment consistent with the present invention, the adjustable optical compensating element is, in its free state, a substantially flat optical element. The substantially flat optical element can be bent into a substantially cylindrical shape using at least one force actuator. Suitable force actuators include for example, a low-friction pneumatic cylinder, where the force exerted by the piston is substantially proportional to the input pressure. In one embodiment, the substantially flat optical element is a transparent flat plate. In another embodiment, the substantially flat optical element is a substantially flat mirror.

In one embodiment consistent with the present invention, the magnitude of the force produced by the force actuator can be varied. In one embodiment, when the force produced by the force actuator is substantially zero, the adjustable optical compensating element will be in its free state, meaning that it is substantially flat (i.e., has substantially zero curvature). In one embodiment consistent with the present invention, the magnitude of force produced by the actuator(s) will produce different magnitudes of curvatures in the adjustable optical compensating element. The curvature produced in the adjustable element may be proportional to the applied force. In one embodiment, not only the magnitude of the force can be varied, but also its direction. Reversing the direction of the applied force reverses the direction of the produced curvature in the adjustable optical compensating element.

Figure 15:
FIG. 15 is a schematic illustrating an adjustable optical compensating element in a first configuration consistent with one embodiment of the present invention.

FIG. 15 schematically shows an adjustable optical compensating element 1510. Adjustable compensating element 1510 is shown in its free state, i.e., substantially flat. Coupled to element 1510 is at least one force actuator 1520, configured to apply a given force having a magnitude and direction to element 1510. In the illustrated embodiment, the force actuator is producing substantially no force.

Figure 16:
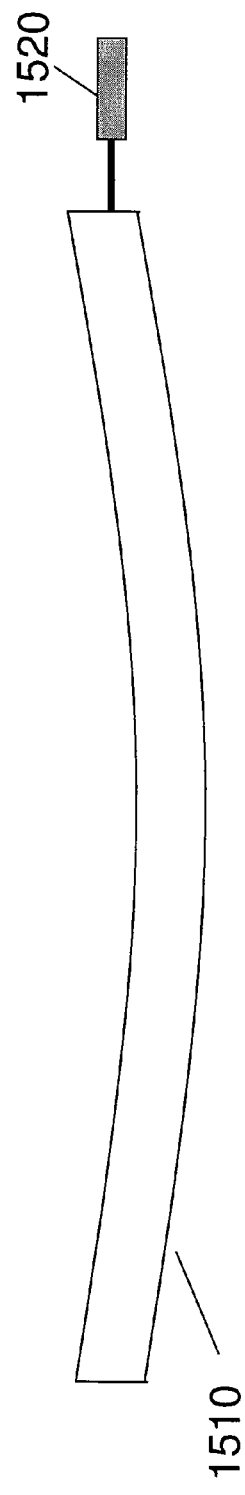
FIG. 16 is a schematic illustrating an adjustable optical compensating element in a second configuration consistent with one embodiment of the present invention.
Figure 17:
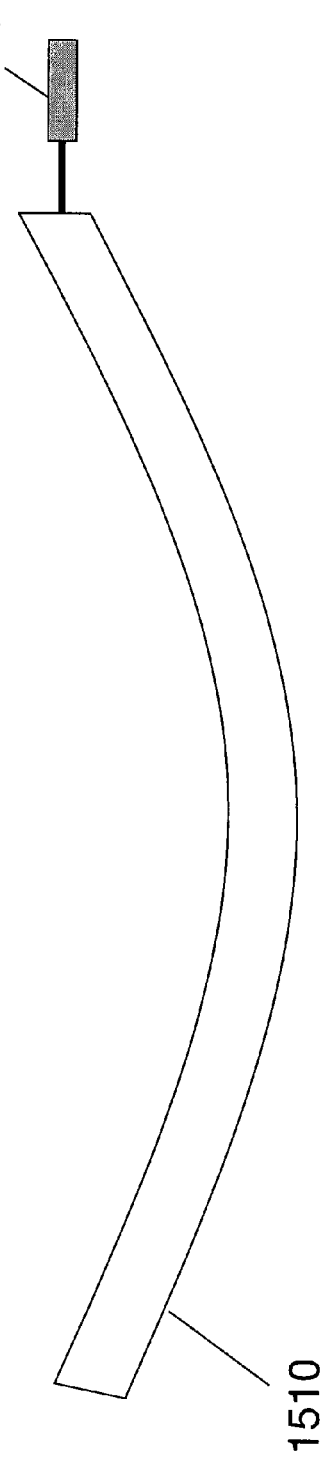
FIG. 17 is a schematic illustrating an adjustable optical compensating element in a third configuration consistent with one embodiment of the present invention.

FIG. 16 schematically shows the optical compensating element 1510 being exposed to a moderate force from actuator 1520. Element 1510 takes on a substantially cylindrical shape having a moderate curvature. FIG. 17 schematically shows the optical compensating element 1510 being exposed to a maximum force from actuator 1520. In this case, element 1510 takes on a substantially cylindrical shape having a maximum curvature.

When the at least one force actuator 1520 reverses the direction of the applied force, the direction of curvature produced in element 1510 reverses as well. This would produce curvatures of similar magnitude as those illustrated in FIG. 16 and FIG. 17, but the direction of curvature would be reversed. In this way, the adjustable optical compensating element 1510 can vary in curvature from zero to moderate or maximum curvatures in either direction (i.e., curvature up or down).

Depicting the adjustable optical compensating element in FIGS. 15-17 does not imply that only three magnitudes of curvature are possible. This depiction is made for eases of explanation, and not by way of limitation. Rather, the magnitude of curvature produced in element 1510 can be infinitely varied (by varying the magnitude of the applied force) between zero and full deflection. Furthermore, the direction of curvature can be reversed by reversing the direction of the applied force from actuator 1520. In this way, the curvature of adjustable optical compensating element 1510 can be controlled according to the requirements of a particular lithographic process recipe.

One principal advantage of the unidirectional bending is to simplify the mechatronics of the patterning device bender. This will make the bender smaller and lighter, thereby minimizing its negative impact on the support structure dynamics, and thus maximizing performance.

The support structure dynamics requirements are to be able to position the pattering device in six degrees of freedom within less than 1 nm, to maintain the position of the support structure relative to the wafer within less than 1 nm, and also to be fast (for example, processing up to 150 wafers/hour).

Additionally, whenever the support structure is being controlled to correct for wafer unevenness, resonant modes may be excited. To account for this, the input signal commanding the support structure fine corrections (for example using a short-stroke positioner) can be filtered to avoid the resonant modes. If the resonant modes are low, bandwidth of the control is sacrificed; consequently, performance suffers. For this reason, high resonant modes are desirable. It is also important to have dynamic reproducibility from one support structure to the next. For all these reasons, one is forced to use a "simple" design.

Unidirectional bending is also cheaper than either using a bidirectional bender (requiring additional actuators or parts) or using an adjustable optical compensating system (which may be very expensive).

Additionally, current lithographic apparatuses already account for the gravity sag of the patterning device in the projection systems, for example, they employ a lens polished to counteract gravity sag. A new "sag profile" corresponding, for example, to the midrange deflection magnitude (and opposite direction) of the bent patterning device would simply be polished instead. Therefore, a unidirectional bender can be added with little difficulty and expense to current systems.

Referring back to FIG. 9, in one embodiment, springblades 310 extend between support structure 300 (which may include a chuck) and clamps 320 which support patterning device 330. The term "springblade" is a generic term describing a structure that is substantially stiff in its own plane (the x-y plane in the embodiment shown in FIG. 9) but readily allows for out of plane movement (e.g., the z-direction). Springblade 310 constrains movement in the x-y plane but allows for deformation along the z-axis. Clamp 320 may be substantially thin and formed of a material capable of deforming to the local topology of patterning device 330. Clamps 320 may be mechanical clamps, vacuum clamps, and/or electrostatic clamps.

An array of linear actuators may extend from reaction frame 340. In the embodiment shown, a row of linear actuators 350 are positioned above the neutral axis of patterning device 330 for positive curvature, and a row of linear actuators 360 are positioned below the neutral axis of patterning device 330 for negative curvature. In this embodiment, one or both of springblades 310 may be desired to be weakened in the x-direction to allow a degree of freedom when patterning device 330 is bent.

Linear actuators 350 and 360 can be Lorentz, reluctance, or piezoelectric linear actuators. Consideration must be given to the stroke, heat dissipation, and stiffness of the choice of linear actuator. In general, the linear piezoelectric actuator may introduce too much stiffness to be of practical use unless special care is taken.

Figure 9:
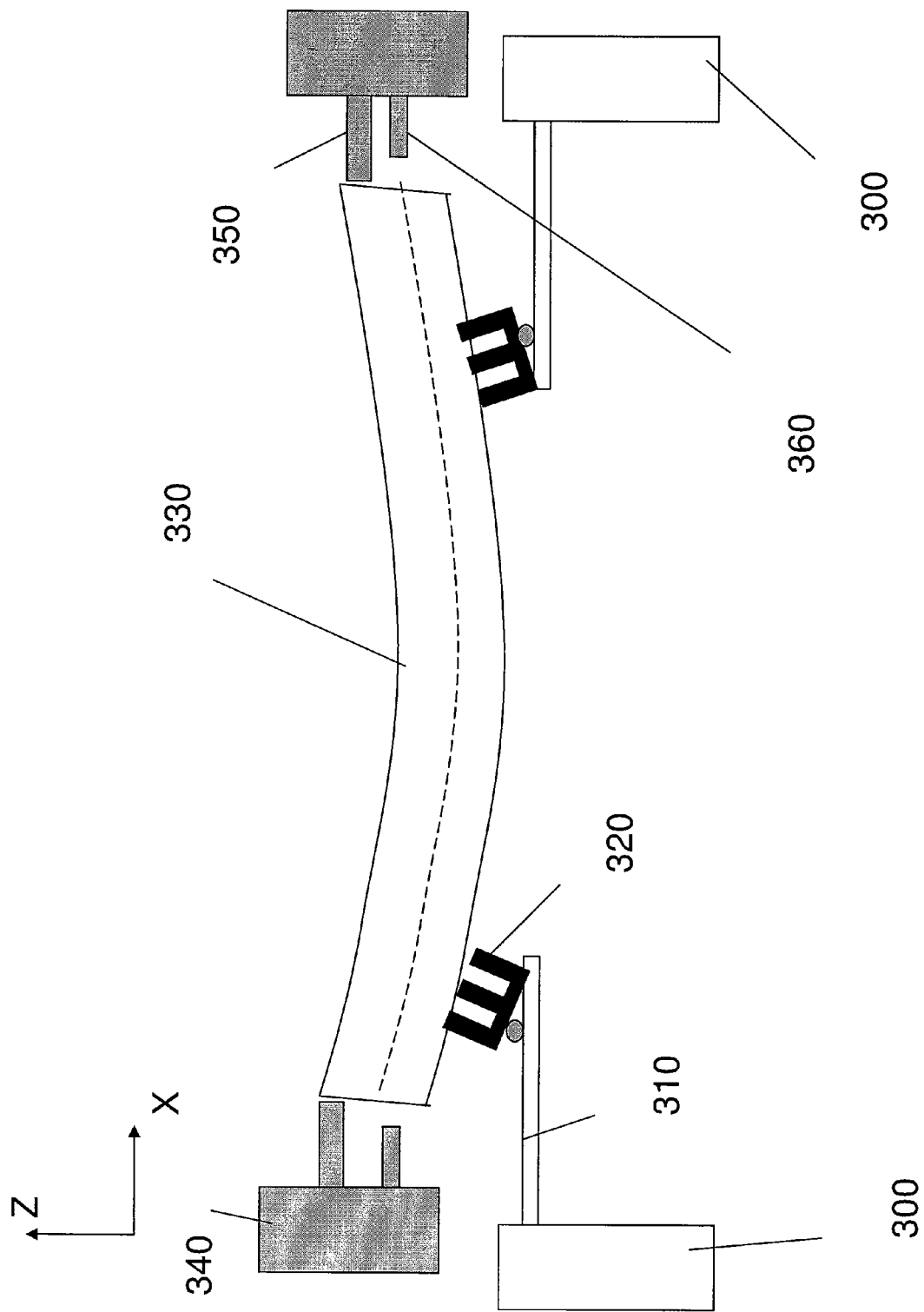
FIG. 9 is a side view of a patterning device being bent by linear actuators consistent with one embodiment of the present invention.

In the embodiment shown in FIG. 9, the patterning device 330 may be subject to some compression. Therefore, birefringence can occur because many materials commonly used as patterning devices, such as quartz and fused silica, have indices of refraction that vary with stress.

Figure 10:
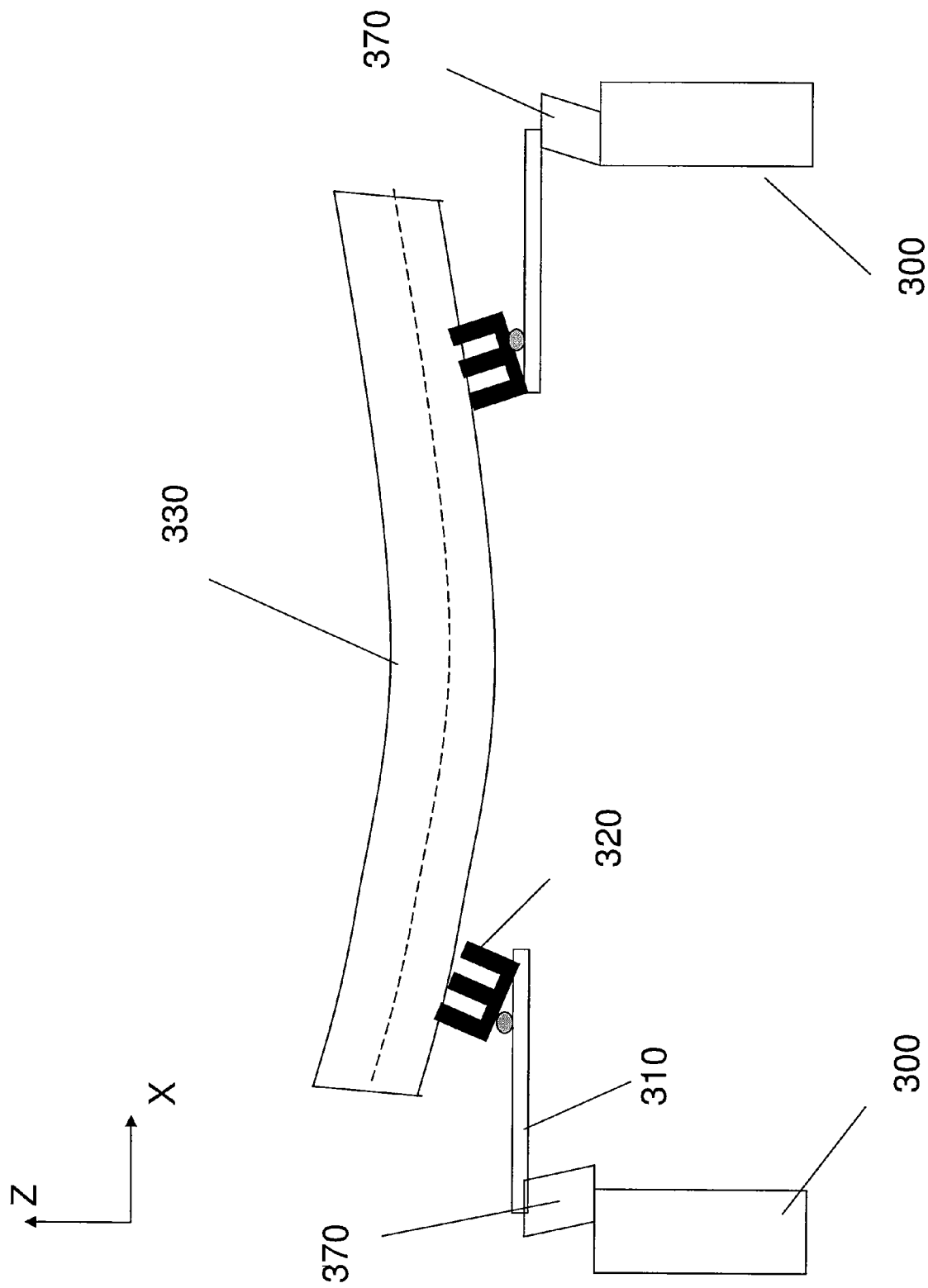
FIG. 10 is a side view of a patterning device being bent by shear actuators consistent with one embodiment of the present invention.

In the embodiment shown in FIG. 10, shear piezoelectric actuators 370 are used instead of linear actuators and a force frame, as was done in the embodiment shown in FIG. 8. In this embodiment an outward deflection of the shear piezoelectric actuators 370 produces a torque which bends patterning device 330 downward. If the deflection of shear piezoelectric actuators 370 can be reversed, the opposite curvature can be generated. In this embodiment, springblades 310 may not need to be weakened to allow for an additional degree of freedom in the x-direction. Also, the stiffness of the shear piezoelectric actuators 370 is not a significant problem because they do not touch patterning device 330. However, since bending may decrease the forces available for y-accelerations, it is important to ensure that slippage cannot occur between patterning device 330 and support structure 300. This is vitally important because typically only the position of the support structure 300 itself is measured (for example with an optical encoder). In other words, the position of the patterning device is assumed to be constant with respect to the known position of the support structure 300. If this assumption is violated by slippage, the end product of the lithography process will be unusable.

Figure 11:
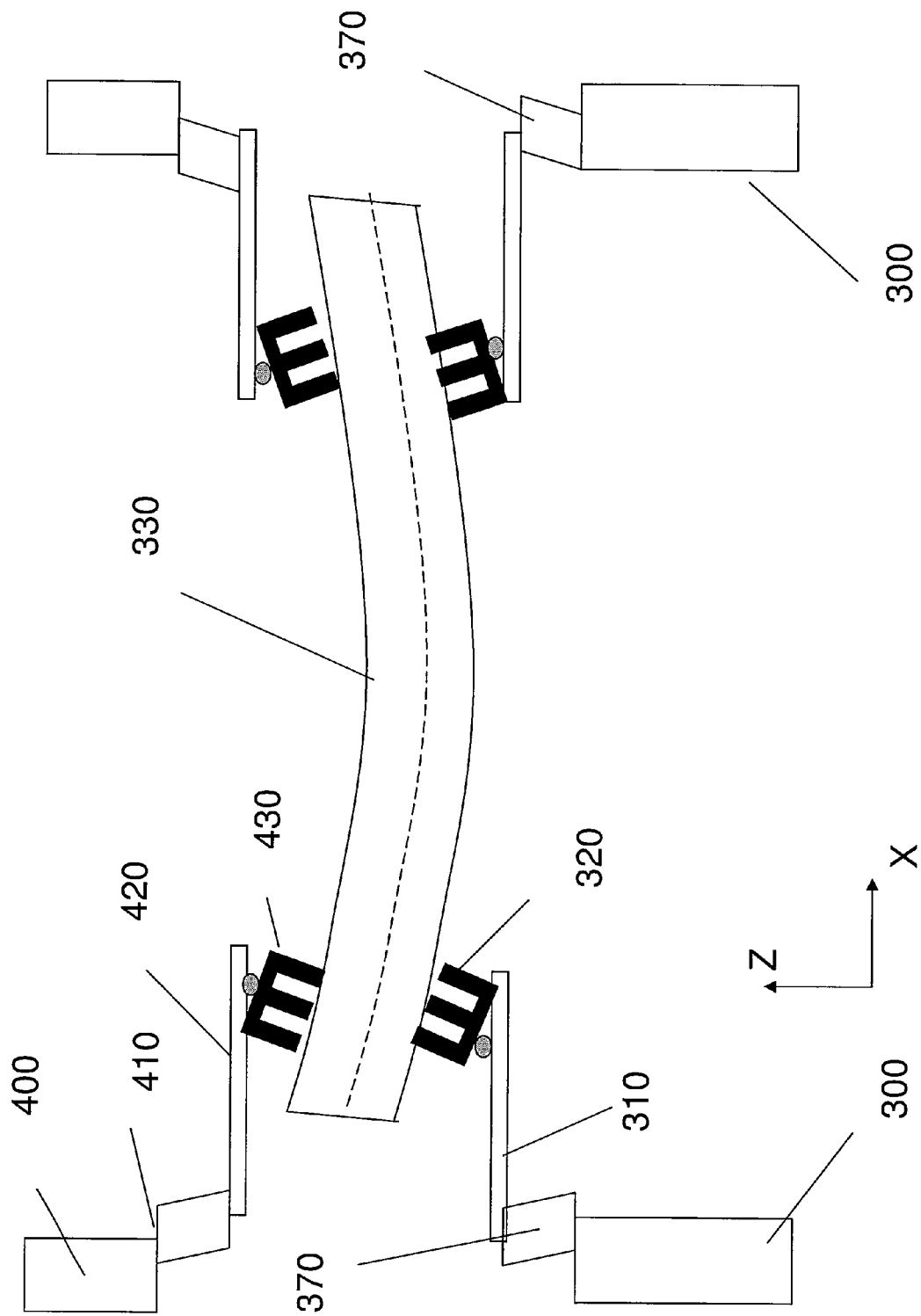
FIG. 11 is a side view of a patterning device being bent by additional shear actuators consistent with one embodiment of the present invention.

A removable part 400 of the support structure can be added in order to accommodate another set of clamps 430, springblades 420 and shear piezoelectric actuators 410. Bending via the top and bottom, as shown in FIG. 11, leads to a substantially pure torque induced in the patterning device 330. In this way, birefringence can be substantially reduced. Additionally, the clamping force is doubled, leading to a decreased possibility of slippage during y-accelerations. In the apparatus shown in FIG. 11, the upper clamps 430 may have to be withdrawn in order to load or unload patterning devices.

Figure 12:
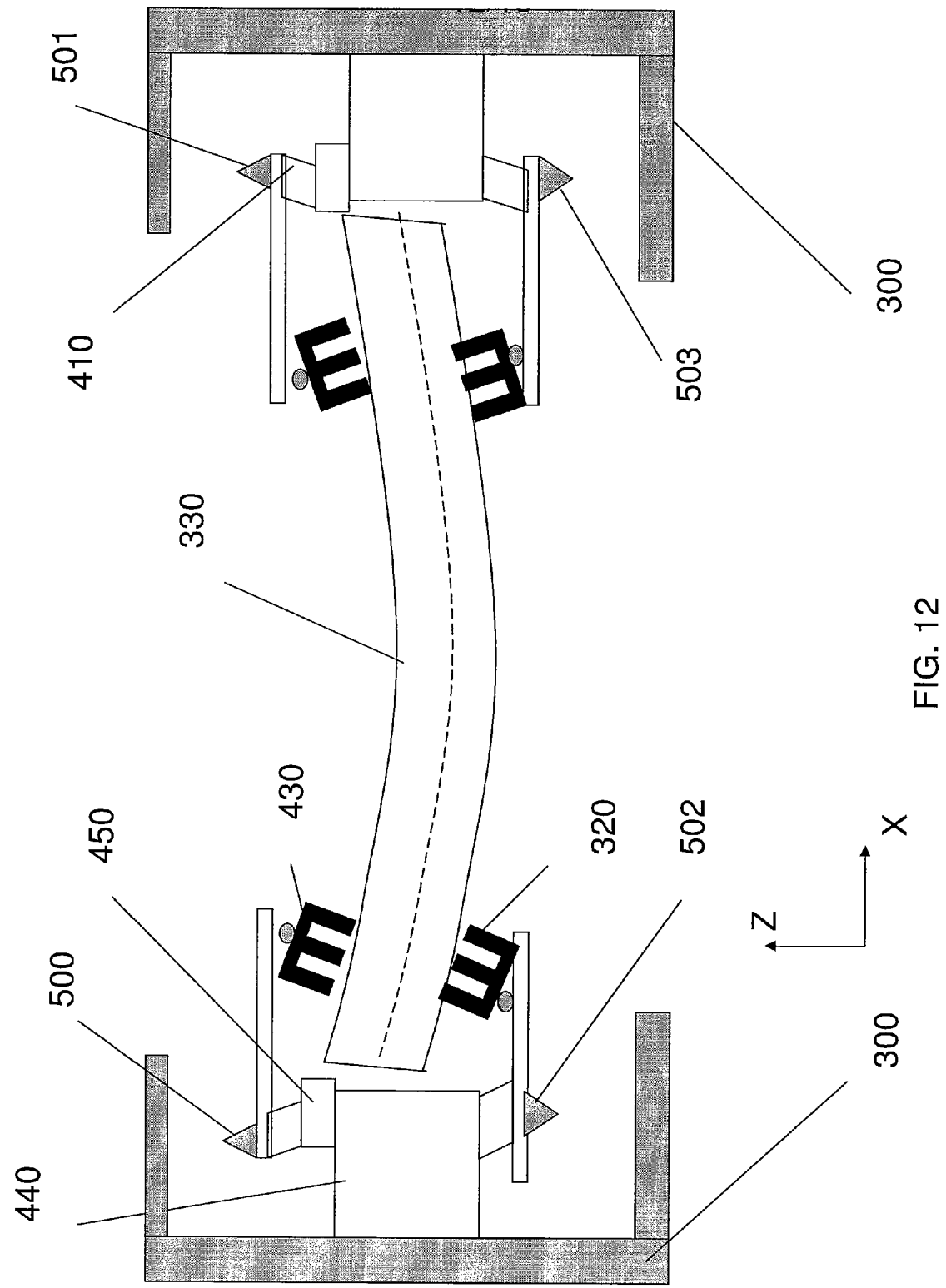
FIG. 12 is side view of a patterning device being bent by shear actuators coupled to a reaction frame consistent with one embodiment of the present invention.

In order to shield a support structure from the bending torque, the shear piezoelectric actuators can be connected to a force frame 440, which is kinematically coupled to the support structure 300, as shown in FIG. 12. In this way, the bending moment will not be substantially experienced by support structure 300. In this embodiment, the top shear piezoelectric actuators 410 may be attached to a movable portion 450 of force frame 440. This is so that the upper clamps 430 can be slid out of the way of patterning device 330 for loading and unloading. To load or unload a pattering device, movable portions 450 slide outward (not shown) providing unobstructed access to patterning device 330.

The inherent hysteresis of the piezoelectric actuators can be overcome by adding optical encoders 500, 501, 502, and 503 to measure the exact positions of the piezoelectric actuators. However, the important information is actually the position of the bendable patterning device 330. Fortunately, there is a linear relationship between the piezoelectric coordinates 500-503 and positions on bendable patterning device 330. This relationship is determined by the stiffness of the patterning device, the clamps, and the force frame 440. This relationship can be calibrated to relate the four encoder signals to the relevant patterning device parameters: expansion in the x-direction, translation in the x-direction, and curvature. In this way, the position of the bendable patterning device 330 can be inferred from the known piezoelectric coordinates.

Shear piezoelectric actuators have a fast reaction time, on the order of 5 ms, so that they are fast enough to update the amount of bending desired between fields of the uneven wafer 10. The actuators are fast enough so that the bending can even be updated within a field ("intrafield").

Figure 13:
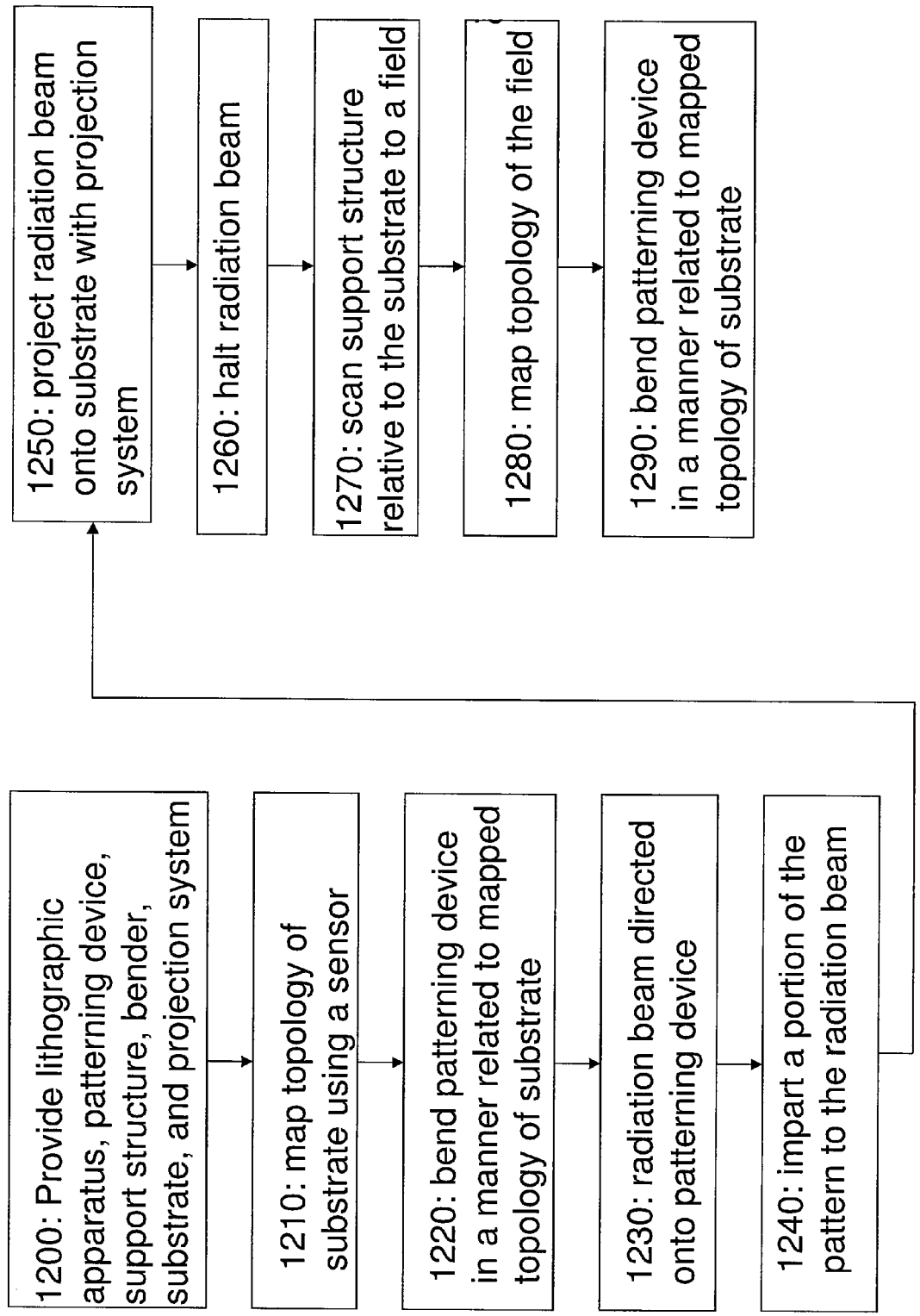
FIG. 13 is flow chart of a method of manufacturing consistent with one embodiment of the present invention.

A method of manufacturing a device utilizing a patterning device bender in a lithographic apparatus is disclosed in FIG. 13. In block 1200, the method includes providing a lithographic apparatus including a patterning device having a pattern thereon, a support structure configured to support the patterning device, a bender configured to bend the patterning device, a substrate, and a projection system. In block 1210, the topology of the substrate is mapped using a sensor. Using a sensor to map a substrate is known in the art. In one embodiment, the substrate may be a wafer. In block 1220, the patterning device is bent with the bender in a manner related to the mapped topology of the substrate. The support structure may be configured to move in a scan direction, and the bending in block 1220 may be done about an axis substantially parallel to the scan direction. In block 1220, the bending may be done in a first direction and the projection system may include an optical compensating element configured to bend a wavefront of the beam in a second direction opposite to the first direction. The optical compensating element can be a fixed optical compensating element, e.g., a lens polished to a substantially cylindrical shape. In block 1230, a radiation beam is directed onto the patterning device. In block 1240, a portion of the pattern is imparted to the radiation beam. In block 1250, the radiation beam is projected from the patterning device onto the substrate with the projection system.

The method may further comprise blocks of 1260 of halting the radiation beam, block 1270 of scanning the support structure relative to the substrate to a field of the substrate, block 1280 of mapping a topology of the field, and block 1290 of bending the patterning device in a manner related to the mapped topology of the field. In this way, the bender can update the bend of the patterning device from field to field of the substrate. In another embodiment, the bender can update the bend of the patterning device within a given field.

Embodiments of the present invention may take the form of a computer program containing one or more sequences of machine-readable instructions describing a method as disclosed above, or a data storage medium or computer readable medium (e.g. semiconductor memory, magnetic or optical disk) having such a computer program stored therein. Such a program or computer readable medium can be stored in a control system or computer system associated with a lithographic apparatus. In one embodiment, the program or computer readable medium can be stored in supervisory control system SCS as shown in FIG. 2.

Figure 14:
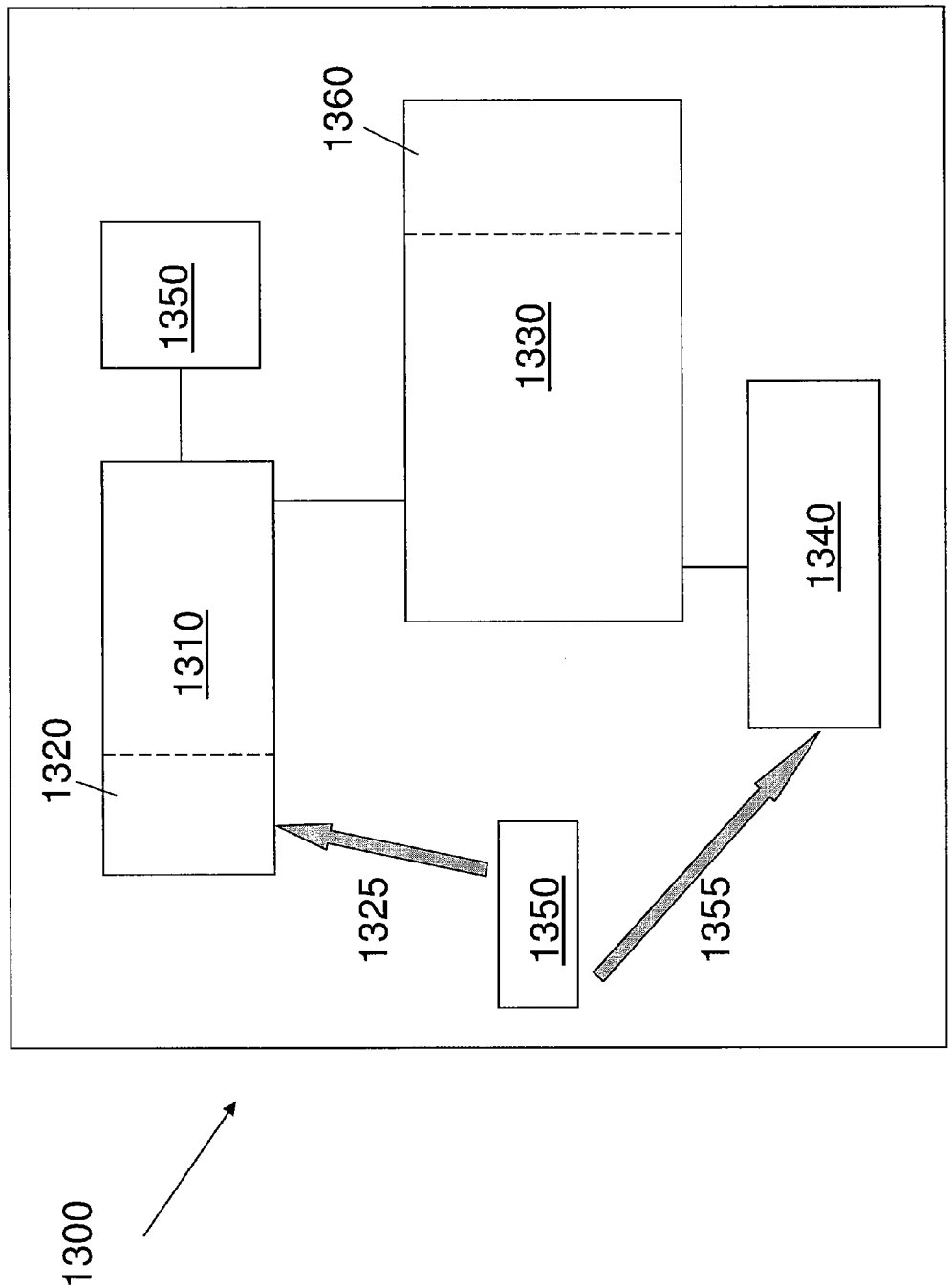
FIG. 14 is schematic diagram of a lithographic apparatus consistent with one embodiment of the present invention.

An embodiment of a lithographic apparatus 1300 is shown schematically in FIG. 14. Lithographic apparatus 1300 has a support structure 1310 for supporting a patterning device having a pattern thereon. Support structure 1310 includes a bender 1320 capable of bending the patterning device. Bender 1320 may include a reaction frame and one or more actuators. The actuators may be linear actuators or shear actuators, for example shear piezoelectric actuators. In one embodiment, lithographic apparatus 1300 includes a radiation source 1350. In another embodiment (not shown), an external radiation source may be used. The radiation source generates a radiation beam. A projection system 1330 is situated between support structure 1310 and a substrate 1340. Substrate 1340 may be supported by a substrate table (not shown). Either or both of support structure 1310 and the substrate table can move relative to the projection system.

Lithographic apparatus 1300 includes a sensor 1350 for mapping the topology of a portion of substrate 1340; the mapping is represented as arrow 1355. In one embodiment, a field of substrate 1340 is mapped. The mapped topology can then be inputted to bender 1320. Input of the mapped topology to the bender is represented as arrow 1325. The bender can in turn bend the patterning device in a manner related to the topology of substrate 1340. Radiation source 1350 (or an external radiation source) then generates a radiation beam which is incident on the patterning device. A portion of the pattern is imparted to the radiation beam, which is then projected by projection system 1330 onto substrate 1340. Projection system 1330 may include an optical compensating element 1360 which can bend a wavefront of the radiation beam before projecting it onto substrate 1340. In one embodiment, optical compensating element 1360 is a fixed compensating element.

After an entire field of substrate 1340 is exposed to the radiation beam, the beam may be halted until the support structure moves to a new field and the new field's topology is mapped by sensor 1350, which in turn updates bender 1320 to a reconfigure the patterning device in a manner related to the new field's topology. This can be repeated until the entire target area of the substrate is exposed. In this way, focus control over an inherently uneven substrate can be greatly improved over existing methods.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A lithographic apparatus including a patterning device handler, comprising:
   a support structure configured to support a patterning device configured to impart a pattern to a radiation beam, the support structure including a bender configured and arranged to apply one or more bending forces to bend the patterning device; and
   a projection system, disposed between the patterning device and a substrate position, capable of projecting the radiation beam onto a substrate located at the substrate position,
   wherein the support structure is configured to move in a scan direction, and the one or more bending forces are applied in a direction that is substantially perpendicular to the scan direction and is substantially parallel to a neutral axis of the patterning device.

2. The lithographic apparatus according to claim 1, wherein the bender is configured and arranged to bend the patterning device in response to a mapped topology of a portion of the substrate.

3. The lithographic apparatus according to claim 2, wherein the mapped portion of the substrate corresponds to a field of the substrate.

4. The lithographic apparatus according to claim 2, wherein the bender is configured for unidirectional bending in a first direction.

5. The lithographic apparatus according to claim 4, wherein the projection system includes an optical compensating element configured to bend a wavefront of the beam in a direction different from and related to the first direction.

6. The lithographic apparatus according to claim 5, wherein the optical compensating element comprises at least one element selected from the group consisting of a lens and a mirror, and is polished to a substantially cylindrical shape.

7. The lithographic apparatus according to claim 5, wherein the optical compensating element is, in its free state, a substantially flat optical element chosen from the group consisting of a transparent flat plate and a flat mirror, and is configured to be bent into a substantially cylindrical shape using a force actuator.

8. The lithographic apparatus according to claim 7, wherein a magnitude of force produced by said actuator can be varied to produce different magnitudes of curvature in the optical compensating element.

9. The lithographic apparatus according to claim 8, wherein when the force is substantially zero, the produced curvature is substantially zero.

10. The lithographic apparatus of claim 8, wherein the direction of the force produced by said actuator is controllable.

11. The lithographic apparatus according to claim 5, wherein the optical compensating element is capable of bending the wavefront of the beam to substantially cancel a bending amplitude and a bending shape of the patterning device such that the beam has a substantially flat wavefront after passing through the optical compensating element.

12. The lithographic apparatus according to claim 2, wherein the bender includes a reaction frame kinematically coupled to the support structure.

13. The lithographic apparatus according to claim 12, wherein the bender includes a linear actuator array extending from the reaction frame, wherein the linear actuator array includes linear actuators selected from the group consisting of Lorentz actuators, reluctance actuators, and piezoelectric actuators.

14. The lithographic apparatus according to claim 1, wherein the patterning device has a center and a pattern and the bender is further configured and arranged to bend the patterning device such that a bending moment is produced causing the center of the patterning device to either move downward or move upward based on a location of the one or more bending forces being applied relative to the neutral axis of the patterning device.

15. The lithographic apparatus according to claim 14, wherein the bender further comprises:
   one or more first actuators extending from a reaction frame, wherein the one or more first actuators are positioned above the neutral axis of the patterning device such that a desired positive curvature is provided to the patterning device by moving the center of the patterning device downward.

16. The lithographic apparatus according to claim 15, wherein the bender further comprises:
   one or more second actuators extending from the reaction frame, wherein the one or more second actuators are positioned below the neutral axis of the patterning device such that a desired negative curvature is provided to the patterning device by moving the center of the patterning device upward.

17. The lithographic apparatus according to claim 16, wherein the one or more first and second actuators include linear actuators comprising Lorentz actuators, reluctance actuators, or piezoelectric actuators.

18. The lithographic apparatus according to claim 16, wherein a first springblade extends between the support structure and a first clamp which supports the patterning device and a second springblade extends between the support structure and a second clamp which supports the patterning device.

19. A support structure constructed and arranged to hold a bendable patterning device in a lithographic apparatus, the support structure comprising:
   a bender configured and arranged to apply one or more bending forces to bend the patterning device in a first direction based on a mapped topology of a substrate for correcting a focus error resulting from a topology of the substrate being patterned when the patterning device imparts pattern to an incident radiation beam,
   wherein the support structure is configured to optically compensate the bending of the patterning device in a second direction being opposite to the first direction, and
   wherein the support structure is configured to move in a scan direction, and the one or more bending forces are applied in a direction substantially perpendicular to the scan direction and substantially parallel to a neutral axis of the patterning device.

20. The support structure according to claim 19, further comprising:
   an optical compensating element configured to optically correct for the focus error, wherein a focus control is provided in a cross-scan direction by bending the patterning device about a scan axis based on the mapped topology of the substrate.

21. A patterning device handler, comprising:
   a support structure configured to hold a patterning device having a center and a pattern,
   wherein the support structure includes a bender configured and arranged to apply one or more forces to bend the patterning device, and
   wherein the support structure is configured to move in a scan direction, and the one or more forces are applied in a direction substantially perpendicular to the scan direction and substantially parallel to a neutral axis of the patterning device.

22. The patterning device handler according to claim 21, wherein a first springblade extends between the support structure and a first clamp which supports the patterning device and a second springblade extends between the support structure and a second clamp which supports the patterning device.

23. The patterning device handler according to claim 21, wherein the bender is configured to bend the patterning device in a first direction based on a mapped topology of a substrate for correcting a focus error resulting from a topology of the substrate being patterned in response to the patterning device imparting at least a portion of the pattern to an incident radiation beam.

24. The patterning device handler according to claim 23, wherein the support structure is configured to optically compensate the bending of the patterning device in a second direction being opposite to the first direction.

* * * * *